United States Patent
Bean, Jr.

(10) Patent No.: US 7,681,410 B1
(45) Date of Patent: Mar. 23, 2010

(54) ICE THERMAL STORAGE

(75) Inventor: John H. Bean, Jr., Wentzville, MO (US)

(73) Assignee: American Power Conversion Corporation, West Kingston, RI (US)

( * ) Notice: Subject to any disclaimer, the term of this patent is extended or adjusted under 35 U.S.C. 154(b) by 899 days.

(21) Appl. No.: 11/355,043

(22) Filed: Feb. 14, 2006

(51) Int. Cl.
F25D 23/12 (2006.01)

(52) U.S. Cl. .............. 62/259.2; 62/59; 62/81; 62/151; 62/196.4; 62/199; 62/200; 361/699

(58) Field of Classification Search ............ 62/3.63, 62/59, 259.2, 81, 151, 199, 200, 196.4; 361/699
See application file for complete search history.

(56) References Cited

U.S. PATENT DOCUMENTS

| | | | |
|---|---|---|---|
| 4,060,997 A | 12/1977 | Shultz et al. | |
| 4,127,008 A | 11/1978 | Tyree, Jr. | |
| 4,285,205 A | 8/1981 | Martin et al. | |
| 4,352,274 A | 10/1982 | Anderson et al. | |
| 4,590,538 A | 5/1986 | Cray, Jr. | |
| 4,696,168 A | 9/1987 | Woods et al. | |
| 4,774,631 A | 9/1988 | Okuyama et al. | |
| 4,827,733 A | 5/1989 | Dinh | |
| 4,837,663 A | 6/1989 | Zushi et al. | |
| 4,851,965 A | 7/1989 | Gabuzda et al. | |
| 4,911,231 A | 3/1990 | Horne et al. | |
| 5,057,968 A | 10/1991 | Morrison | |
| 5,090,207 A * | 2/1992 | Gilbertson et al. ............. 62/59 |
| 5,173,819 A | 12/1992 | Takahashi et al. | |
| 5,177,666 A | 1/1993 | Bland et al. | |
| 5,210,680 A | 5/1993 | Scheibler | |
| 5,323,847 A * | 6/1994 | Koizumi et al. ........ 165/104.33 |
| 5,440,450 A | 8/1995 | Lau et al. | |
| 5,497,288 A | 3/1996 | Otis et al. | |
| 5,544,012 A | 8/1996 | Koike | |
| 5,649,428 A | 7/1997 | Calton et al. | |
| 5,657,641 A | 8/1997 | Cunningham et al. | |
| 5,671,805 A | 9/1997 | Stahl et al. | |
| 5,711,155 A * | 1/1998 | DeVilbiss et al. ............. 62/3.7 |
| 5,718,628 A | 2/1998 | Nakazato et al. | |
| 5,724,827 A * | 3/1998 | Yamaguchi et al. .......... 62/201 |
| 5,982,618 A | 11/1999 | Roos | |
| 6,032,472 A | 3/2000 | Heinrichs et al. | |
| 6,034,873 A | 3/2000 | Stahl et al. | |
| 6,101,459 A | 8/2000 | Tavallaei et al. | |
| 6,198,628 B1 | 3/2001 | Smith | |
| 6,213,194 B1 | 4/2001 | Chrysler et al. | |

(Continued)

*Primary Examiner*—Frantz F Jules
*Assistant Examiner*—Azim Rahim
(74) *Attorney, Agent, or Firm*—Lando & Anastasi, LLP (57) ABSTRACT

A system, configured to be disposed in a information technology equipment rack for providing ice thermal storage, includes a tank configured to hold water, a heat exchanger disposed in water in the tank and configured to convey a two-phase liquid and vapor refrigerant and to transfer heat between the water and the refrigerant, a first valve connected to a liquid and a vapor refrigerant line and configured to selectively connect the liquid refrigerant line to a first port and the vapor refrigerant line to a second port in a first mode and to connect the liquid refrigerant line to the second port and the vapor refrigerant line to the first port in a second mode, a thermostatic expansion valve connected to an inlet of the heat exchanger, and a liquid/vapor pump connected to an outlet of the heat exchanger and to the second port of the first valve.

3 Claims, 9 Drawing Sheets

U.S. PATENT DOCUMENTS

| | | |
|---|---|---|
| 6,222,729 B1 | 4/2001 | Yoshikawa |
| 6,253,567 B1 | 7/2001 | Imanari et al. .................. 62/434 |
| 6,305,180 B1 | 10/2001 | Miller et al. |
| 6,317,320 B1 | 11/2001 | Cosley et al. |
| 6,334,331 B1 | 1/2002 | Chen et al. |
| 6,374,627 B1 | 4/2002 | Schumacher et al. |
| 6,375,561 B1 | 4/2002 | Nicolai et al. |
| 6,400,567 B1 | 6/2002 | McKeen et al. |
| 6,414,845 B2 | 7/2002 | Bonet |
| 6,459,579 B1 | 10/2002 | Farmer et al. |
| 6,462,944 B1 | 10/2002 | Lin |
| 6,506,111 B2 | 1/2003 | Sharp et al. |
| 6,508,068 B2 * | 1/2003 | Ohkawara .................... 62/185 |
| 6,535,382 B2 | 3/2003 | Bishop et al. |
| 6,574,104 B2 | 6/2003 | Patel et al. |
| 6,611,428 B1 | 8/2003 | Wong |
| 6,637,219 B2 | 10/2003 | Leisenheimer et al. |
| 6,668,565 B1 | 12/2003 | Johnson et al. |
| 6,704,196 B1 | 3/2004 | Rodriguez et al. |
| 6,724,624 B1 | 4/2004 | Dodson |
| 6,775,137 B2 | 8/2004 | Chu et al. |
| 6,778,386 B2 | 8/2004 | Garnett et al. |
| 6,813,897 B1 | 11/2004 | Bash et al. |
| 6,819,560 B2 | 11/2004 | Konshak et al. |
| 6,822,859 B2 | 11/2004 | Coglitore et al. |
| 6,859,366 B2 | 2/2005 | Fink |
| 6,880,349 B2 | 4/2005 | Johnson et al. |
| 6,889,752 B2 | 5/2005 | Stoller |
| 6,924,977 B2 | 8/2005 | Bestwick et al. |
| 6,924,981 B2 | 8/2005 | Chu et al. |
| 6,980,433 B2 | 12/2005 | Fink |
| 7,046,514 B2 | 5/2006 | Fink et al. |
| 7,051,802 B2 | 5/2006 | Baer |
| 7,106,590 B2 | 9/2006 | Chu et al. |
| 7,120,021 B2 | 10/2006 | Hamman |
| 7,140,193 B2 | 11/2006 | Johnson et al. |
| 7,145,772 B2 | 12/2006 | Fink |
| 7,165,412 B1 | 1/2007 | Bean, Jr. |
| 7,173,820 B2 | 2/2007 | Fink et al. |
| 7,259,963 B2 | 8/2007 | Germagian et al. |
| 7,365,973 B2 | 4/2008 | Rasmussen et al. |
| 2001/0029747 A1 | 10/2001 | Gaul |
| 2001/0042616 A1 | 11/2001 | Baer |
| 2002/0007464 A1 | 1/2002 | Fung |
| 2003/0030975 A1 | 2/2003 | Bestwick et al. |
| 2003/0042004 A1 | 3/2003 | Novotny et al. |
| 2003/0158718 A1 | 8/2003 | Nakagawa et al. |
| 2004/0100770 A1 | 5/2004 | Chu et al. |
| 2004/0190247 A1 | 9/2004 | Chu et al. |
| 2005/0225936 A1 | 10/2005 | Day |
| 2005/0237715 A1 | 10/2005 | Staben et al. |
| 2005/0237716 A1 | 10/2005 | Chu et al. |
| 2006/0126296 A1 | 6/2006 | Campbell et al. |
| 2006/0139877 A1 | 6/2006 | Germagian et al. |
| 2006/0162357 A1 | 7/2006 | Fink et al. |
| 2006/0232945 A1 | 10/2006 | Chu et al. |
| 2007/0038414 A1 | 2/2007 | Rasmussen et al. |
| 2007/0072536 A1 | 3/2007 | Johnson et al. |
| 2007/0074537 A1 | 4/2007 | Bean et al. |
| 2007/0076373 A1 | 4/2007 | Fink |
| 2007/0078635 A1 | 4/2007 | Rasmussen et al. |
| 2007/0163748 A1 | 7/2007 | Rasmussen et al. |
| 2007/0165377 A1 | 7/2007 | Rasmussen et al. |
| 2007/0167125 A1 | 7/2007 | Rasmussen et al. |
| 2007/0174024 A1 | 7/2007 | Rasmussen et al. |
| 2007/0190919 A1 | 8/2007 | Donovan et al. |
| 2008/0041077 A1 | 2/2008 | Tutunoglu |
| 2008/0105412 A1 | 5/2008 | Carlsen et al. |
| 2008/0141703 A1 | 6/2008 | Bean, Jr. |
| 2008/0142068 A1 | 6/2008 | Bean et al. |

* cited by examiner

FIG. 9

ICE THERMAL STORAGE

BACKGROUND OF THE INVENTION

Rack-mounted communications and information technology equipment is widely used in today's society. This equipment consumes electrical power and generates heat. Heat produced by the rack-mounted equipment can have adverse effects on the performance, reliability and useful life of the equipment components. Thus, cooling systems are used to cool the equipment.

To help guard against malfunction in equipment due to power failure, uninterruptible power supplies (UPSs) are often used to provide backup power in case of a power outage. UPSs are commonly used on computing equipment to guard against data being lost due to a power outage before the data are saved. UPSs used with computing equipment also help to guard against a loss in service by providers of information over the Internet, such as by servers, e.g., hosting web pages.

Cooling of communications and information technology equipment is desirable during main power failure, and while the equipment operates on a UPS and continues to generate heat.

SUMMARY OF THE INVENTION

In general, in an aspect, the invention provides a system for use in an information technology equipment rack housing and for use with a pumped refrigerant cooling system that includes vapor and liquid refrigerant lines, the system including a tank configured to hold water, a heat exchanger disposed in the tank and configured to convey a two-phase liquid and vapor refrigerant and to transfer heat between water in the tank and the refrigerant, a first valve includes first and second ports and being connected to the liquid and vapor refrigerant lines and configured to selectively connect the liquid refrigerant line to the first port and the vapor refrigerant line to the second port in a first mode and to connect the liquid refrigerant line to the second port and the vapor refrigerant line to the first port in a second mode, a second valve connected to the first port of the first valve and to an inlet of the heat exchanger, the second valve being a thermostatic expansion valve, a third valve connected to the first port of the first valve and to the inlet of the heat exchanger and configured to direct vapor refrigerant from the first port of the first valve to the inlet of the heat exchanger independent of the second valve, and a liquid/vapor pump connected to an outlet of the heat exchanger and to the second port of the first valve.

In general, in another aspect, the invention provides an ice storage system including a system housing configured to have rack-mountable information technology equipment mounted to the system housing, a thermoelectric peltier cooler configured to transfer heat between an ice system coolant and an external coolant source, a first heat exchanger configured to transfer heat between a refrigerant circuit and a plurality of coolant circuits, and an ice storage tank including: a tank housing configured to provide a reservoir for holding water, and a second heat exchanger disposed in the tank housing and configured to convey coolant and to transfer heat between water in the housing and the coolant, where the ice storage tank, the thermoelectric pettier cooler, and the first heat exchanger are disposed inside the system housing.

Implementations of the invention may include one or more of the following features. The system further includes another ice storage tank disposed in the system housing. Each ice storage tank includes a level indicator configured to monitor a water level in the respective tank and to provide a level indication of the level of water in the respective reservoir. Each ice storage tank includes a shutoff valve configured to selectively inhibit the coolant from flowing through the respective second heat exchanger in response to the respective level indication indicating that an amount of ice in the corresponding reservoir is above a threshold amount.

In general, in another aspect, the invention provides a method of generating ice for cooling information technology equipment using an ice thermal storage system disposed in a information technology equipment rack using a pumped refrigerant cooling system that includes vapor and liquid refrigerant lines, the method comprising chilling a coolant to at least less than 32° F. using a peltier cooler and electrical power, supplying the coolant chilled by the peltier cooler to a heat exchanger disposed in water in a storage tank, and transferring heat from the water in the tank to the coolant inside of the heat exchanger such that the water changes phase into ice.

In general, in another aspect, the invention provides a system for providing thermal energy storage in the form of ice to cool heat producing equipment, the system including a tank configured to hold water, a first heat exchanger disposed in water in the tank, a system housing configured to be rack-mountable inside a information technology equipment rack, and cooling means for transferring heat out of the water to generate ice and is configured to convey a two-phase liquid and vapor refrigerant through the first heat exchanger to transfer heat between the water and the refrigerant, where the tank and cooling means are disposed inside the system housing.

In general, in another aspect, the invention provides a system for providing thermal energy storage in the form of ice to cool heat producing equipment, the system including a tank configured to hold water, a first heat exchanger disposed in water in the tank, a system housing configured to be rack-mountable inside a information technology equipment rack, and cooling means for transferring heat out of the water to generate ice, and the cooling means includes a thermoelectric peltier cooler configured to transfer heat between a system coolant and an external coolant source.

Implementations of the invention may include one or more of the following features. The cooling means includes a second heat exchanger configured to transfer heat between a refrigerant circuit and a plurality of coolant circuits. The cooling means includes another ice storage tank, each ice storage tank including a level indicator configured to monitor a water level in the respective tank and to provide a level indication of the level of water in the respective reservoir. The cooling means is configured such that each ice storage tank includes a shutoff valve configured to selectively inhibit the coolant from flowing through the respective second heat exchanger in response to the respective level indication indicating that an amount of ice in the corresponding reservoir is above a threshold amount.

Various aspects of the invention may provide one or more of the following capabilities. Equipment can be cooled during power failures using battery power and thermal ice storage. Cooling capacity and storage can be scalable. A simple standardized ice storage unit can be provided. Backup cooling can work in conjunction with pumped refrigerant cooling systems. Ice may be produced using 45° F. chilled water as heat of rejection. Lower evaporating pressure of pumped R134a can be achieved using a vapor pump. The lower evaporating pressure allows an evaporating temperature low enough to freeze water to ice. The main pumped refrigerant system does not normally require temperatures low enough to freeze water and hence does not require low evaporating pressures. The vapor pump enables the system to save compressor power by only lowering the pressure of a portion of the pumped liquid refrigerant beyond that of which the main system would normally require. Ice can be generated using a chilled water loop, while a main external chilled water loop remains at normal operational temperature.

These and other capabilities of the invention, along with the invention itself, will be more fully understood after a review of the following figures, detailed description, and claims.

DETAILED DESCRIPTION OF PREFERRED EMBODIMENTS

Embodiments of the invention provide techniques for cooling information technology (IT) equipment while one or more UPSs support the operation of the IT equipment, e.g., during main power failure, or at any other time cooling is desired. An exemplary embodiment of the invention includes a rack-mountable ice/water tank that has a submersed tubular fin coil. The ice/water tank generates and stores ice during normal operation with the IT equipment drawing electric power from building power. During building power failure and UPS operation, the ice/water tank operates as a heat sink for the coolant to remove heat from the IT equipment, e.g., for the duration of the UPS battery life or depletion of ice in the storage system. An exemplary embodiment utilizes a portion of liquid refrigerant from a pumped liquid refrigerant system, which is expanded in the tubular fin coil submersed in the ice/water tank, thereby reducing the water temperature to the freezing point and adsorbing the latent hear of fusion necessary for the phase change of water to ice. Another exemplary embodiment utilizes chilled water fed through a thermal electric chiller. The cold side of the thermal electric chiller is sufficiently chilled to allow the water/glycol solution circulated between it and the tubular fin coil submersed in the ice/water tank to freeze the water contained within the tank. Other embodiments are within the scope of the invention.

Figure 1:
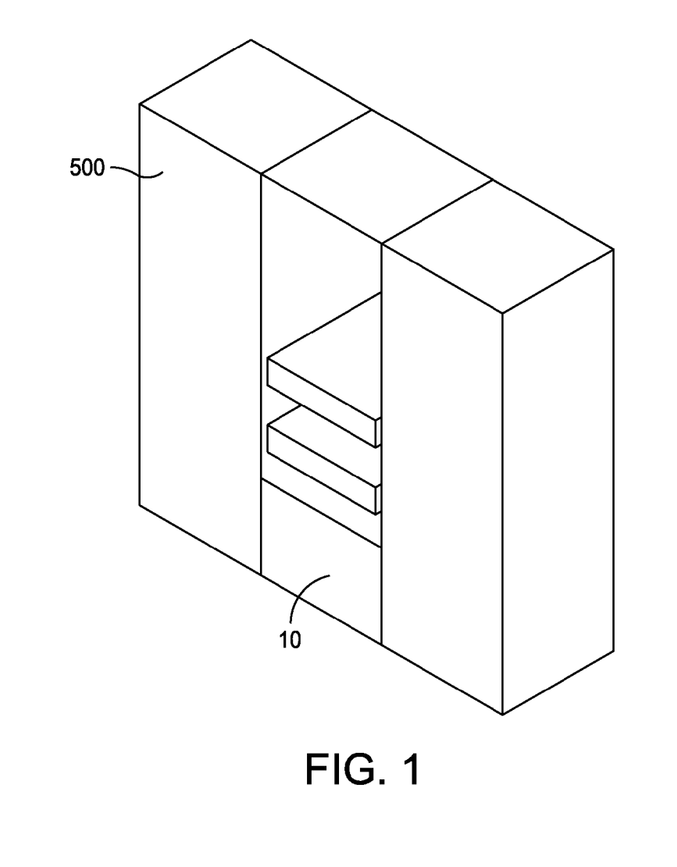
FIG. 1 is a simplified diagram of an IT equipment rack system, with an internally mounted ice thermal storage system.

Referring to FIG. 1, an equipment rack housing 500 of industry-standard dimensions for housing rack-mountable information technology equipment includes an ice thermal storage system 10. The equipment rack housing 500 here includes one system 10, but could include more than one of the systems 10. The system 10 is configured to use liquid R134a or chilled water and building electrical power to produce ice during up times of building power and to condense the R134a or chill water for use in cooling the IT equipment during times of building power failure.

Figure 2:
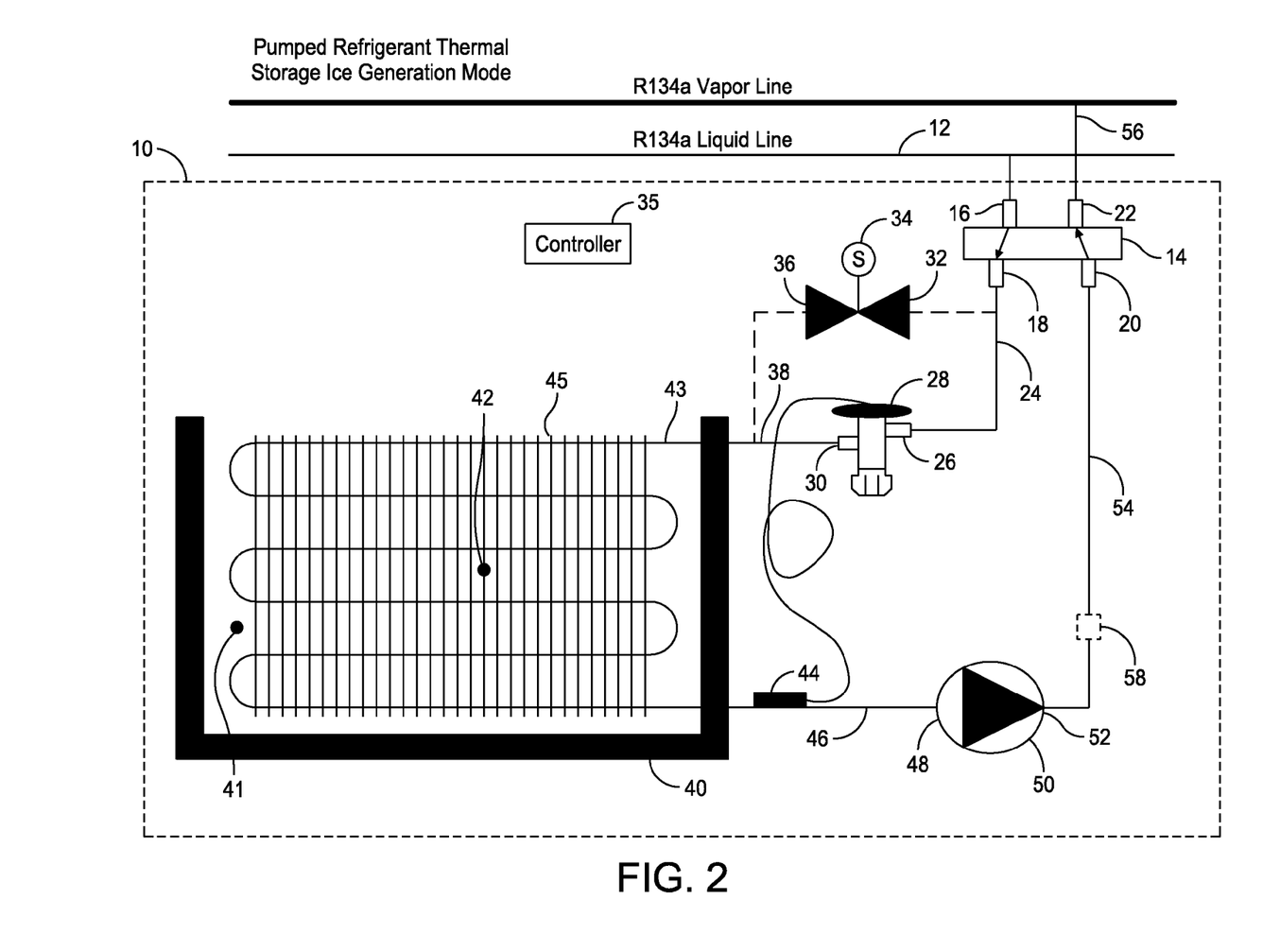
FIG. 2 is a simplified schematic of a pumped refrigerant ice thermal storage system in ice generation mode.
Figure 3:
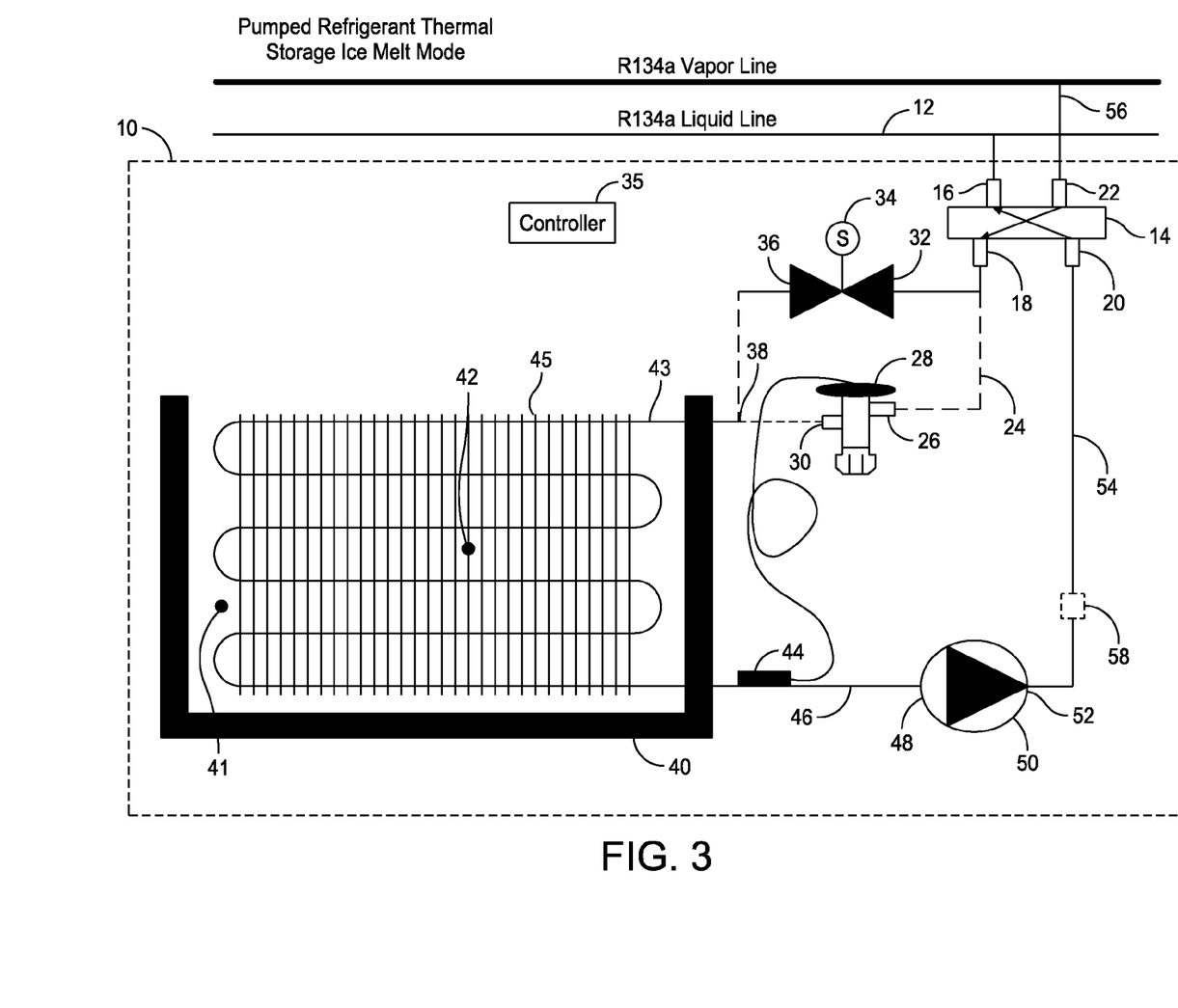
FIG. 3 is a simplified schematic of the pumped refrigerant ice thermal storage system shown in FIG. 2, in ice melt mode.

Referring to FIGS. 2-3, the pumped refrigerant ice thermal storage system 10 is connected to refrigerant lines 12, 56 and includes a four-way reversing valve 14, a bypass solenoid valve 34, a controller 35, a thermostatic expansion valve 28, an ice/water tank 40 with a finned tubular heat exchanger 42, and a liquid/vapor pump 50. The system 10 is configured to operate in an ice-generation mode as shown in FIG. 2, or in an ice-melt mode as shown in FIG. 3. The system 10 is configured to use pumped liquid refrigerant from the main cooling refrigerant line 12 to generate ice in the ice/water tank 40 via a vapor compression cycle, and to increase refrigerant vapor pressure enough for transfer of the refrigerant into the main pumped vapor refrigerant line 56.

The four-way reversing valve 14 is configured to control flow of refrigerant between the system 10 and the lines 12, 56. For the purposes of this application, a valve may include multiple valves to perform the same function. The four-way reversing valve is a conventional refrigerant reversing valve used in heat pump systems. The valve 14 has ports 16, 22 connected to the lines 12, 56 respectively. The valve 14 is configured to operate in 2 modes corresponding to the ice generation mode and the ice melt mode of the system 10. The valve 14 is coupled to the controller 35 and is configured to switch to, or stay in, an operational mode in response to information (e.g., signals, commands) from the controller 35. In the ice generation mode, the valve 14, connects the port 16 with an outlet port 18 to allow high pressure liquid refrigerant, here R134a (although other refrigerants may be used), in the input line 12 to enter the system 10 at the port 16 and be directed to the port 18. In this mode, the four-way reversing valve 14 also connects a port 20 to the port 22 to allow vapor refrigerant to enter the port 20 from a line 54 and for the vapor refrigerant from port 20 to exit the valve 14 through the port 22. In the ice melt mode, the valve 14 connects the port 22 with the outlet port 18 to allow vapor refrigerant in the vapor line 56 to enter the system at the port 22 and to allow the refrigerant vapor inlet from the port 22 to exit the valve 14 through the output port 18. In this mode, the four-way reversing valve 14 also connects the port 20 to the port 16 to allow liquid refrigerant to enter the valve 14 through the port 20 from the system line 54 and for the liquid from the port 20 to exit the valve 14 through the port 16 which is connected to the high pressure liquid refrigerant main line 12. In either mode, the output port 18 is connected to the line 24 to direct refrigerant to the line 24.

The system line 24 is connected to an input port 26 of the thermostatic expansion valve 28 that is configured to drop the pressure of the liquid refrigerant as it passes through the valve 28. The pressure of the liquid refrigerant is dropped to allow two-phase flow within the heat exchanger 42, which increases the heat transfer coefficient, allowing more efficient heat transfer. The more efficient heat transfer allows for greater thermal capacity for a given mass flow. The thermostatic expansion valve 28 is a control valve configured to regulate the pressure drop of the refrigerant in the valve 28 depending on temperature and pressure within the evaporator heat exchanger 42. The valve 28 is configured to regulate the rate of refrigerant flow into the evaporator in accordance with an indication of outlet pipe temperature/pressure sensed by, and received from, a remote bulb 44. The valve 28 is a type of forward pressure reducing regulator that has a remote pressure/temperature reference, here the bulb 44, which can sense the temperature at the outlet. The valve 28 can change the pressure loading on the spring bias of the thermostatic valve 28 to adjust the valve orifice size to allow more or less flow through the valve 28 to try to maintain a desired pressure/temperature at the reference bulb 44. The valve 28 regulates the flow such that the temperature and pressure within the heat exchanger 42 is appropriate for two phase flow and evaporation to occur. Thus the valve 28 automatically restricts the refrigerant flow if the tank/heat exchanger 40, 42 is already cold and hence not evaporating the refrigerant. An output 30 of the valve 28 is connected to a line 38.

The system line 24 is also connected to the bypass solenoid valve 34 that is configured and disposed to allow vapor refrigerant to pass through in ice melt mode when the valve 34 is open, and to inhibit or block the flow of liquid refrigerant in ice generation mode when the valve 34 is closed. The bypass valve 34 is an electrically actuated valve in this embodiment, but could be actuated by any alternate means such as air or hydraulic. The valve 34 is configured to respond to respond to signals from the controller 35 to be open for the ice melt mode and to be closed during the ice generation mode. The bypass valve 34 has a flow orifice sized to allow sufficient refrigerant vapor to pass to the heat exchanger 42 when the valve 34 is in an open state to cool the vapor to provide desired cooling of the IT equipment while producing an acceptable system pressure drop that can be overcome by the liquid/vapor pump 50. An outlet port 36 of the bypass valve 34 is connected to the system line 38, which is connected to the inlet of the finned tubular heat exchanger 42.

The tubular finned heat exchanger 42 is configured, disposed, and connected to the line 38 to receive the liquid refrigerant in ice generation mode from the valve 28 or the vapor refrigerant in ice melt mode from the valve 34. The heat exchanger 42 is further configured to direct the refrigerant inside of its tube 43 to exchange heat between the refrigerant and water 41 in the tank 40. the tube 43 is heat conductive and is connected to each of several heat conductive fins 45 multiple times. The fins 45 facilitate heat transfer between the refrigerant in the tube and the water 41. The heat exchanger 42 is situated and oriented to be substantially immersed in an ice/water bath inside the ice/water tank 40. The heat exchanger 42 is configured to allow a two phase mixture of vapor/liquid refrigerant on the inside of the tube. The heat exchanger 42 can act as an evaporator inside of which the liquid refrigerant undergoes a phase change to vapor in the ice generation mode. This phase change process removes enough heat from the ice/water tank 40 to form ice (i.e. change the water 41 from liquid to solid). The heat exchanger 42 can also act as a condenser in the ice melt mode such that the vapor refrigerant is cooled by the ice/water bath on the outside of the heat exchanger 42 and changes phase to liquid. The heat exchanger 42 could have multiple tubes 43 but is configured such that its internal tubular circuit terminates in a common location that is connected to a system line 46, which is connected to the liquid/vapor pump 50. The heat exchanger 40 is dimensioned such that it fits substantially within the ice/water tank 40 and inside of a standard information technology equipment rack housing 500.

The ice/water tank 40, is configured to hold an ice/water mixture and the heat exchanger 42. The ice/water tank 40 is dimensioned such that it can fit into a standard information technology equipment rack housing 500. The ice/water tank 40 is configured to hold 100 liters of water in addition to the submersed heat exchanger 40 for an approximate cooling capacity of 20 kW for 17 minutes if the water volume is mostly frozen.

An inlet port 48 of the liquid/vapor pump 50 is connected to the system line 46, which is connected to the outlet of the heat exchanger 42. The liquid/vapor pump 50 is configured to mechanically alter the pressure of the refrigerant in the line 46. The pump 50 can increase the pressure of the vapor refrigerant in the ice generation mode by an appropriate amount to allow reintroduction of the vapor to the refrigerant vapor line 56 through the four-way reversing valve 14. The liquid/vapor pump 50 is configured to mechanically increase the pressure of the liquid refrigerant in the ice melt mode by an appropriate amount to allow reintroduction of the liquid refrigerant to the liquid refrigerant line 12 through the four-way reversing valve 14. An outlet port 52 of the liquid/vapor pump 50 is connected to the system line 54 which is connected to the inlet port 20 of the four-way reversing valve 14. The liquid/vapor pump 50 is driven by an electrical motor, although other means could be used to drive the pump 50, such as a hydraulic drive. The speed and operation of the liquid/vapor pump 50 is regulated by the controller 35. The pump 50 could be operated in a variable speed mode by using a pressure sensing element 58 at the discharge of the pump 50 and regulating the speed of the pump 50 as required to obtain the desired pressure boost. The pump 50 could also be operated in a steady-state speed mode in which the controller 35 sets the pump 50 speed to a predetermined value depending on what mode the system 10 is in. The pump 50 is, here, a linear piston pump model #15 from PumpWorks, Inc. 1125 Nathan Lane North Plymouth, Minn. USA 55441. The exemplary pump model listed is given as an example of a baseline pump that is suitable, but that would have to be modified to obtain desirable performance in this configuration.

Figure 4:
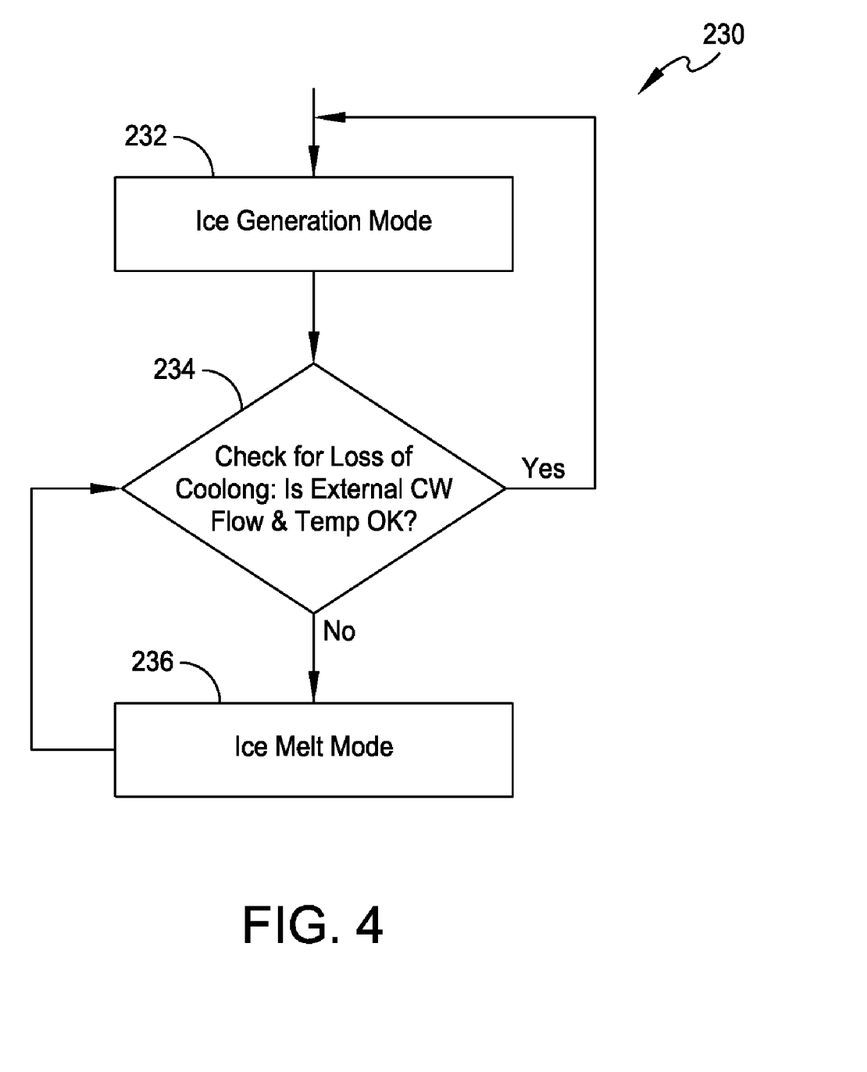
FIG. 4 is a block flow diagram of a process of detecting coolant loss and switching the system shown in FIGS. 2 and 3 to ice melt mode as shown in FIG. 3.

Referring to FIG. 4, with further references to FIGS. 2 and 3, a process 230 for producing and using backup cooling using the system 10 includes the stages shown. The process 230 is exemplary and not limiting. The process 230 may be modified, e.g., by adding, removing, or rearranging stages. At stage 232, the system 10 is operating in ice generation mode. The system 10 generates and maintains ice in the tank 40 at an acceptable level using building power. At stage 234, the controller 35 checks the flow and temperature of the external cooling source. If the temperature and flow are within acceptable ranges, the external cooling has been confirmed and the system returns to stage 232. If the flow and/or temperature is not within an acceptable respective range, then the controller 35 determines that the external cooling is insufficient and the process 230 proceeds to stage 236 where the controller 35 changes the system 10 to the ice melt mode to use the stored ice to provide cooling capacity, as described below with respect to FIG. 6.

Figure 5:
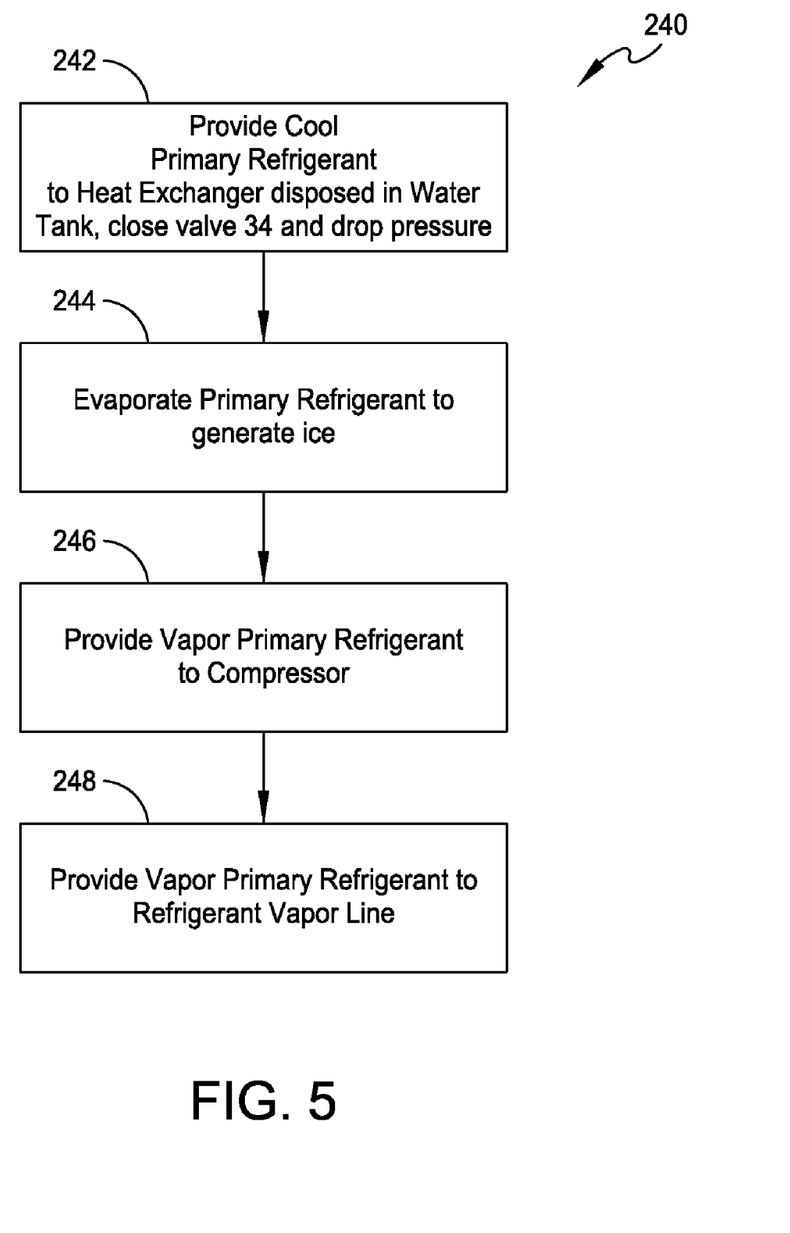
FIG. 5 is a block flow diagram of a process of generating ice using the ice thermal storage system shown in FIG. 2.

Referring to FIG. 5, with further reference to FIG. 2, a process 240 of ice generation using the ice thermal storage system 10 includes the stages shown. The process 240 of ice generation is exemplary and not limiting. The process 240 may be modified, e.g., by adding, removing, or rearranging stages.

At stage 242, high pressure saturated liquid refrigerant is supplied to the heat exchanger 42 disposed in the ice/water tank 40. In this stage, the four-way reversing valve is activated by the controller 35 to connect ports 16 to 18 and 20 to 22 as in FIG. 2. The refrigerant passes from the liquid refrigerant line 12 through the four-way valve 14 to the thermostatic expansion valve 28. The bypass solenoid valve 34 is closed in response to a command/signal from the controller 35, and liquid refrigerant in the line 24 enters the thermostatic expansion valve 28 through the inlet port 26. The pressure of the liquid refrigerant is dropped/reduced by the expansion valve 28 so that the refrigerant is at a temperature less than 32° F. The refrigerant is metered into the heat exchanger 42 by the expansion valve 28, which adjusts its orifice and the corresponding refrigerant flow rate in response to the heat exchanger 42 outlet temperature as measured by the bulb 44 and indicated to the valve 28.

At stage 244, the refrigerant changes phase into a vapor. As the refrigerant passes through the heat exchanger 42, heat is transferred from the water in the tank 40 into the refrigerant such that the refrigerant changes phase to vapor and the water freezes, forming ice.

At stage 246, the refrigerant vapor is provided to the compressor 50. The compressor 50 mechanically increases the pressure of the refrigerant vapor to at least a level such that the pressure of the vapor refrigerant approximates or is slightly greater than the pressure of the refrigerant vapor line 56. The pump 50 could be set to a predetermined speed for each mode by the controller 35, or a control algorithm in conjunction with a pressure sensing element 58 could be used by the controller 35 to regulate the pump speed as required to obtain the desired pressure boost.

At stage 248, the increased pressure refrigerant vapor is provided back to the main refrigerant vapor line 56 via the four-way valve 14. The refrigerant vapor will be chilled by the building cooling system, e.g., chilled water, or some other means such as external heat dump radiators, and recycled to the line 12.

Figure 6:
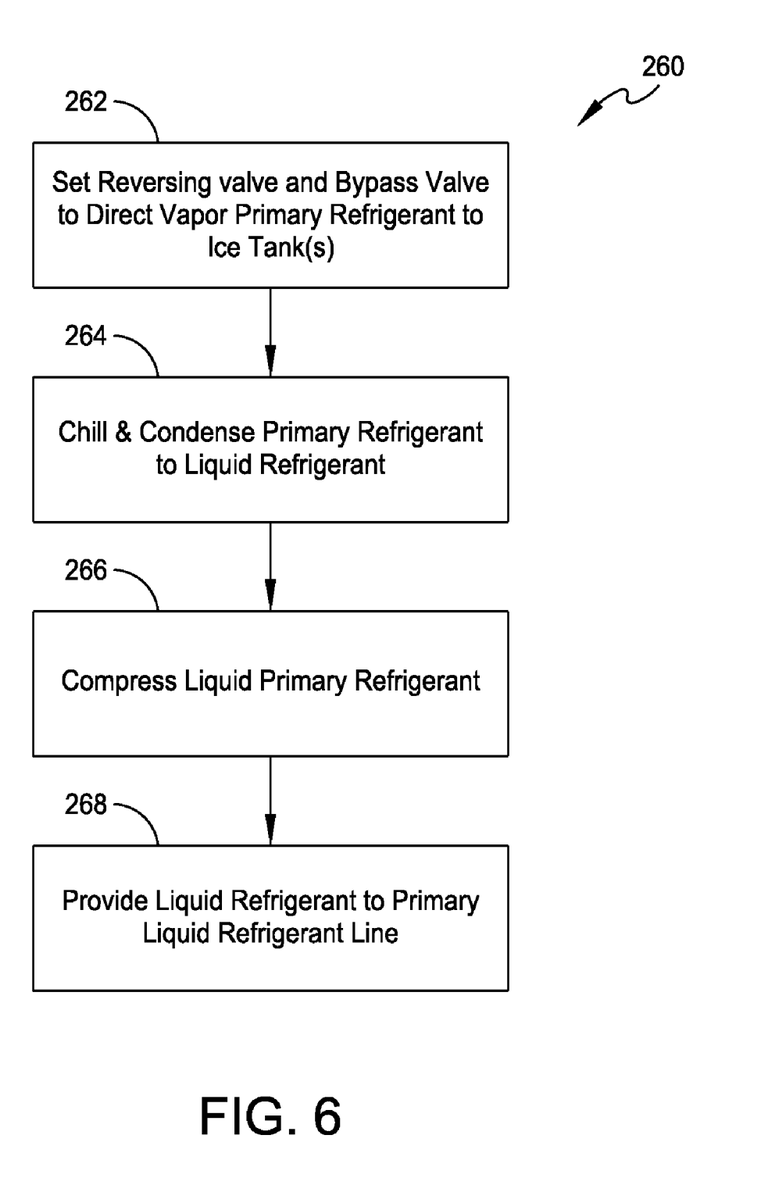
FIG. 6 is a block flow diagram of a process of melting ice, to cool refrigerant for use in cooling IT equipment, using the ice thermal storage system shown in FIG. 3.

Referring to FIG. 6, with further reference to FIG. 3, a process 260 of melting ice to cool refrigerant using the ice thermal storage system 10 includes the stages shown. The process 260 is exemplary and not limiting. The process 260 may be modified, e.g., by adding, removing, or rearranging stages.

At stage 262, vapor refrigerant is provided to the heat exchanger 42 disposed in the ice tank 40. The vapor refrigerant passes from the main vapor line 56 through the four-way valve 14, which in this mode has been configured by the controller 35 to connect ports 22 to 18 and 20 to 16, as in FIG. 3. The refrigerant passes from the vapor refrigerant line 56 through the four-way valve 14, and through the solenoid valve 34 which has been opened by the controller 35. With the bypass valve 34 open, the resistance is much less than that of the valve 28 and thus the refrigerant flows through the bypass valve 34.

At stage 264, the vapor refrigerant enters the heat exchanger 42 disposed in the ice tank 40. The vapor refrigerant gives off heat to the ice in the tank 40 as it passes through the heat exchanger 42. That heat release chills the vapor refrigerant such that it condenses, changing phase to a liquid by the end/exit of the heat exchanger 42. The heat release of the condensing refrigerant melts the ice into liquid water.

At stage 266, the liquid refrigerant exits the heat exchanger 42 and is provided to the compressor 50. The compressor 50 mechanically increases the pressure of the liquid refrigerant to at least a level such that its pressure is similar or greater than that of the liquid in the line 12 and hence can be reintroduced into the liquid refrigerant line 12. The compressor 50 may be set at an appropriate predetermined speed by the controller 35 for this mode. A control algorithm in conjunction with a pressure sensing element 58 could also be used by the controller 35 to regulate the pump speed as required to obtain the desired pressure boost. At stage 268, the liquid refrigerant is provided back to the primary liquid refrigerant line 12, via the four-way valve 14, by entering port 20 which is connected to port 16 as configured by the controller 35 in this mode.

Figure 7:
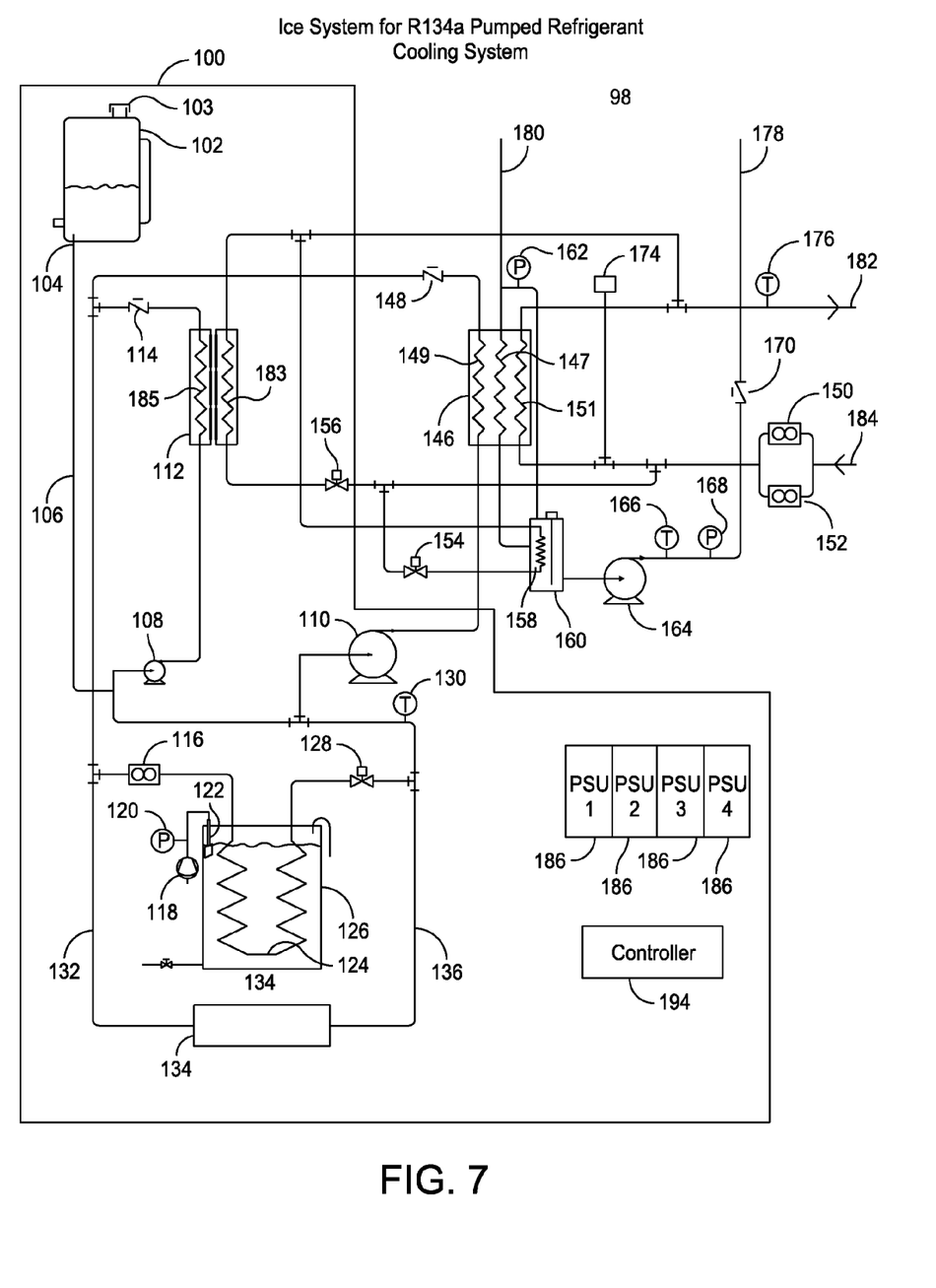
FIG. 7 is a schematic of a thermoelectric cooler ice thermal storage system.

Referring to FIG. 7, a cooling system 98 includes a main pumped refrigerant condenser heat exchanger 146 and an ice thermal storage system 100 that includes a thermal expansion tank 102, an ice generation glycol mixture circulation pump 108, an ice melt glycol mixture circulation pump 110 (however a single variable speed pump could be used), a Peltier cooler 112, and two tank modules 134 (one shown simply as a box) that each include an ice/water storage tank 126 that incorporates a finned heat exchanger 124, an air pump 118, a differential pressure sensor 120, a fluid level monitoring tube 122, and a flow regulation valve 128. Further, the number of ice/water storage tanks 126 shown is exemplary and not limiting, with fewer or more tank modules 134 being possible.

The thermal expansion tank 102 holds a water-glycol mixture. The thermal expansion tank 102 is configured to allow the level of the water-glycol mixture to vary without overflowing as the mixture expands and contracts with temperature variances of the mixture. The thermal expansion tank 102 is also configured to allow filling of the system with the water-glycol mixture through a filling opening 103, and addition of makeup mixture to offset a low level, e.g., due to leaks or other losses of fluid. The thermal expansion tank 102 is preferably disposed in a higher vertical position than inlets of the ice generation and ice melt pumps 108, 110 to allow easier priming of the ice generation glycol mixture circulation pump 108 and the ice melt glycol mixture circulation pump 110. The thermal expansion tank 102 has an outlet port 104 disposed on its lower portion through which the water-glycol mixture can exit the tank 102. The outlet port 104 of the tank 102 is connected to a system line 106, which is connected to an inlet of the ice generation glycol mixture circulation pump 108, to an inlet of the ice melt glycol mixture circulation pump 110, and to a water-glycol mixture return line 136.

The ice generation glycol mixture circulation pump 108 is configured and disposed to mechanically induce flow of the coolant to circulate the coolant through a loop that includes the Peltier cooler 112 and the various ice storage modules 134. The output of the ice generation glycol mixture circulation pump 108 is connected to the "cold side" of the Peltier cooler 112. An outlet of the "cold side" of the Peltier cooler 112 is connected to a check-valve 114. An outlet of the check-valve 114 is connected to a glycol mixture supply line 132. The glycol mixture supply line 132 is connected to the inlet(s) of the ice storage module(s) 134. Specifically, the glycol mixture supply line 132 connects to an inlet of the flow-meter 116 of the ice storage module 134. An outlet of the flow-meter 116 is connected to an inlet of the heat exchanger 124.

The ice/water storage tank 126 holds water that may be converted to ice. The heat exchanger 124 disposed in the ice/water storage tank contains a water-glycol mixture. The heat exchanger 124 is connected to the glycol return line 136 through the motorized flow control valve 128, that allows variable ice generation control of the tank 126 and thus between multiple ice/water storage modules 134.

Ice quantity can be monitored using the air pump 118, the pressure sensor 120, and the monitoring tube 122. The tube 122 is submersed in water in the tank 126 and pressurized using the air pump 118. The air pressure within the tube 122 displaces the water column in the tube 122 with a small quantity of air escaping in the form of bubbles from an opening in a bottom of the tube 122. The air pressure within the tube is directly proportional to the column height of water displaced which is related to the amount of ice in the tank 126 (as more ice is formed, the water expands and occupies more volume such that the liquid level rises). The pressure sensor 120 monitors the pressure used to displace the water from the tube 122. The monitored pressure is used to provide ice quantity information (e.g., in real time) and is used by a controller 194 to regulate the motorized valve 128 to reduce glycol flow for tanks 126 approaching ice capacity, to increase the glycol flow for tanks 126 approaching minimal acceptable ice capacity, and to isolate the tank module 134 from the glycol solution supply line 132 for fully ice regenerated tanks 126. Thus, one of the ice tank modules 134 may continue to receive the secondary coolant and continue to produce ice while the other tank module 134 does not (e.g., helping to prevent over freezing in the tank 126 that fully regenerates before the other). The controller 194 can also utilize information from the ice storage module 134 flow-meter 116 (which has an internal temperature sensor) and glycol return temperature sensor 130 to calculate a demand on the ice storage module 134. This calculated heat transfer demand in combination with the aforementioned ice quality measurement can be used to calculate in real time a cooling capacity remaining or time until ice depletion for the ice system 100.

The glycol-mixture return line 136 is connected to the inlet of the ice generation glycol mixture circulation pump 108 and the ice melt glycol mixture circulation pump 110. The ice melt glycol mixture circulation pump 110 is configured to provide the required coolant flow to the main condenser 146 in ice melt mode in order to cool the main refrigerant. The pump 110 provides higher relative flow rates than the ice generation pump 108 to allow greater heat transfer rates during the ice melt mode. An exemplary thermal electric chiller Peltier device has a heat transfer cooling capacity of approximately 1,200 watts net. During ice melt mode the heat transfer requirements may approach values as high as about 20,000 watts. Also, if the higher relative flow rates of the ice melt mode were used during the ice generation mode without increasing the line capacity (e.g., diameter), the higher pumping head losses associated with pumping a higher flow rate would raise the temperature of the fluid and reduce the ice generation capacity of the system 100. This two pump layout is only exemplary and the same function could be accomplished with a variable speed pump, diverter valve and flow measurement device, or other configurations. The outlet of the ice melt glycol mixture circulation pump 110 is connected to the ice system glycol mixture inlet of the main condenser heat exchanger 146. The outlet of the main condenser heat exchanger 146 ice system glycol mixture is connected to a check-valve 148, that is connected to the glycol mixture supply line 132.

The Peltier cooler 112 is configured to act as an active heat pump which transfers heat from the heated ice storage glycol mixture being provided by the ice generation pump 108 to building chilled water provided by a main external chilled water source 184. The Peltier cooler 112 comprises Peltier or TEC (thermo-electric cooler) elements which act as active heat pumps when voltage is applied to them. The Peltier cooler 112 draws electrical current from the TEC power supplies 186, and drives the temperature of the ice storage glycol mixture loop below 32° F. to allow freezing of the water in the ice/water storage tank 126. The number of the TEC power supplies 186 is exemplary and not limiting, with fewer or more power supplies 186 than shown being possible to power the Peltier cooler 112. The heat gained from the "cold" side source of the ice storage glycol mixture along with heat generated from electrical inefficiencies of the Peltier cooler 112 is rejected into a hot side sink 183 of the Peltier cooler 112. This hot side sink 183 has conventional 45° F. chilled water circulated through it from the main building chiller loop 184,182. The specific model of the peltier cooler is HT-199-1.4-0.8 from TE Technology, Inc. 1590 Keane Dr., Traverse City, Mich. 49686-8257.

The main condenser heat exchanger 146 is connected to a refrigerant vapor return line 180 that carries refrigerant from the IT equipment and is configured to cool and condense the vapor refrigerant to liquid. The main condenser heat exchanger 146 is a three circuit heat exchanger model number WP7M-TD-94 from WTT America, Inc. 1630 Ocean Avenue Bohemia, N.Y. 11716, although other heat exchangers may be used. The three circuit heat exchanger 146 comprises a single refrigerant circuit 147 and two coolant or chilled water circuits 147, 151. The refrigerant circuit 147 in the heat exchanger 146 rejects heat to the external chilled water circuit 151, or an ice storage coolant circuit 147, or both. The normal operation heat sink for the condenser 146 is the main external chiller water source 184 and external chilled water circuit 151. The main external chilled water flow is measured with two flow-meters 150, 152, although other quantities of flow-meters could be used. The main external chilled water flow through the main condenser heat exchanger 146 is controlled with the motorized diverter valve 174. The temperature of a external chilled water flow return 182 is monitored with a temperature sensor 176. During power loss and UPS operation, the heat sink for the condenser 146 is the ice storage glycol circuit 149.

The refrigerant exits the main condenser 146 and enters a refrigerant reservoir 160, which is configured to maintain/ensure the sub-cooled physical state of the liquid refrigerant before it enters a refrigerant pump 164. The reservoir 160 contains a heat exchanger 158 connected and configured to have chilled water from the building supply 184 circulate through it. The flow of chilled water through the reservoir heat exchanger 158 is controlled via a motorized valve 154. For example, the controller 194 opens the valve 154 when there is sufficient external building chilled water cooling, and closes the valve 154 when there is insufficient external chilled water cooling due to power loss. The heat exchanger 158 is sized and configured to maintain the sub-cooling of the refrigerant entering the refrigerant circulation pump 164. The heat exchanger 158 is substantially submersed in liquid refrigerant in the reservoir 160, and transfers heat between the liquid refrigerant and the building chilled water inside of the heat exchanger 158. The refrigerant reservoir 160 allows refrigerant to be added or removed as need from the system. The refrigerant reservoir 160 also includes a low pressure port connected to a differential pressure sensor 162 that has a high pressure port connected to the refrigerant vapor return line 180.

Pressure values from the sensor 162 are used by a pressure PID controller to determine and send control signals to the glycol flow control valve 174. These control signals cause the valve 174 to regulate glycol/water flow to maintain the main condenser 146 inlet pressure at a desired level, which allows proper temperature and two phase heat exchange of the refrigerant. In ice melt mode, the control variable of the pressure controller switches to the variable speed control of the ice system glycol pump 110. These control signals cause the pump 110 to regulate glycol flow to maintain the main condenser 146 inlet pressure at a desired level, which also allows proper temperature and two phase heat exchange of the refrigerant.

A refrigerant pump 164 is connected to the reservoir 160 and is configured to mechanically increase the liquid refrigerant pressure. An outlet of the refrigerant pump 164 has a pressure sensing element 168 for measuring the liquid refrigerant supply pressure. The outlet of the refrigerant pump 164 is connected to a check-valve 170 to ensure one-directional flow of a liquid refrigerant supply line 178.

The controller 194 is connected to components of the system 100 for monitoring and controlling operation of the system 100. Functions described below relating to devices (e.g., HD controllers) and/or to control of devices noted may be performed by measuring appropriate characteristics of the system 100, monitoring measurements by the controller 194, having the controller 194 manipulate the measurements, and having the controller 194 provide appropriate control signals to appropriate devices. The controller 194 may be physically disposed within the module 100, or external to the module 100, e.g., in an industry standard rack 500. Further, more than one controller may be used, and the controllers may be disposed at different locations. Also, one controller could serve as the controller 194 for multiple modules 100. The discussion below refers only to the controller 194, but other embodiments are included in the discussion by reference to the controller 194.

Figure 8:
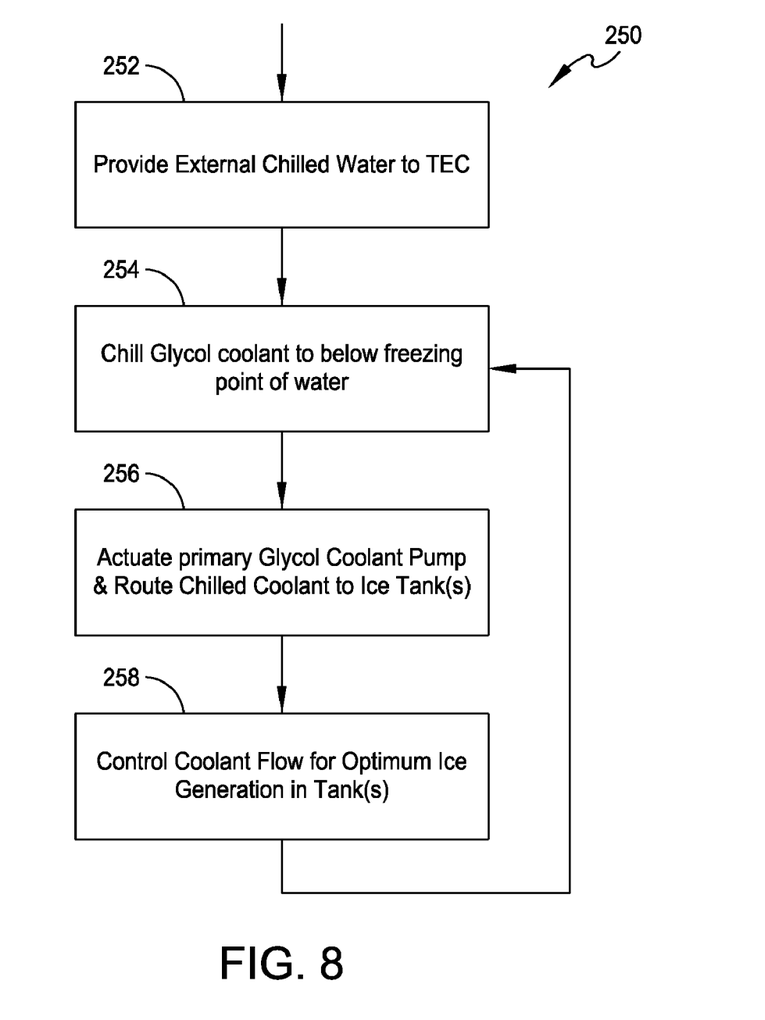
FIG. 8 is a block flow diagram of a process of generating ice using the ice thermal storage system shown in FIG. 7.

Referring to FIG. 8, with further reference to FIG. 7, a process 250 of ice generation using the cooling system 98 includes the stages shown. The process 250 is exemplary and not limiting. The process 250 may be modified, e.g., by adding, removing, or rearranging stages.

At stage 252, building chilled water is supplied to the Peltier cooler 112. The controller 194 causes the valve 156 to open to allow external chilled water to flow to the Peltier cooler 112.

At stage 254, the glycol coolant is chilled below 32° F. for use in freezing water in the tanks 126. The Peltier cooler 112 draws electric current from the power supply(ies) 186, and drives the temperature of the glycol in the "cold" side 185 of the Peltier cooler below 32° F. by rejecting the heat to the external chilled water loop return 182.

At stage 256, the controller 194 actuates the primary glycol coolant pump 108 to pump the chilled coolant to the ice tank modules 134. the pump 108 pumps the glycol through the Peltier cooler 112 and to the modules 134. At stage 258, the controller 194 regulates the glycol mixture coolant flow for ice generation in the ice tank modules 134.

As the coolant passes through the heat exchanger 124, heat is transferred from the water in the tank 126 into the glycol coolant such that the water freezes forming ice. The formation of ice causes the level of the water in the corresponding tanks 126 to rise, increasing the pressure to overcome in the tube 122 by the air pump 118. When the level rises to a desired level, as detected by the pressure sensor 120, then the flow of coolant to that tank module 134 is stopped by the controller 194 causing the closing of the outlet control valve 128. When the levels of all the tank modules 134 reach desired levels, then the ice-making mode is preferably terminated.

Referring to FIG. 4, the controller 194 will determine when there is a loss of main building power by detecting a loss of proper external chilled water flow and/or temperature. If this occurs, the controller 194 signals to the system 100 to switch to ice melt mode.

Figure 9:
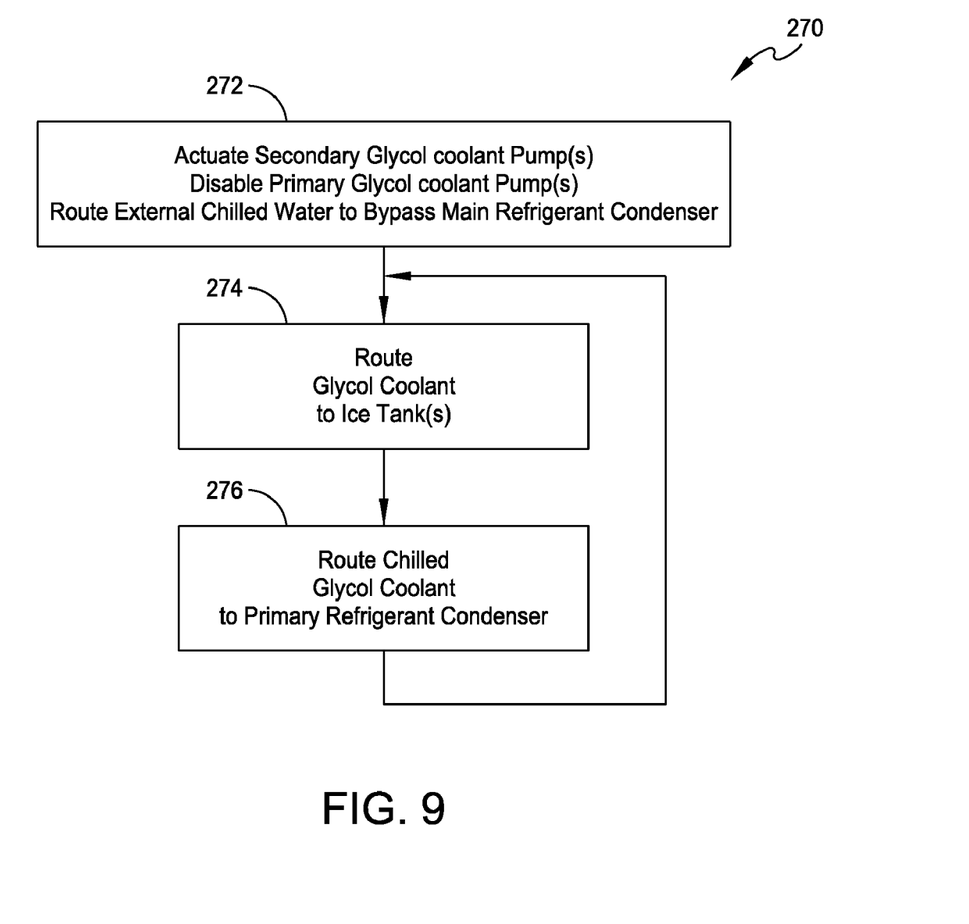
FIG. 9 is a block flow diagram of a process of melting ice, to cool refrigerant for use in cooling IT equipment, using the ice thermal storage system shown in FIG. 7.

Referring to FIG. 9, with further reference to FIG. 7, a process 270 of melting ice to cool the refrigerant using the ice thermal storage system 100 includes the stages shown. The process 270 is exemplary and not limiting. The process 270 may be modified, e.g., by adding, removing, or rearranging stages.

At Stage 272, the controller 194 actuates the ice melt glycol coolant pump 110 via backup power in response to an indication of main building power failure, to provide coolant to the condenser 146, and disables the ice generation glycol coolant pump 108 and the Peltier cooler 112. The controller 194 actuates the control valve 174 to route the external chilled water to bypass the main refrigerant condenser 146.

At stage 274, the glycol coolant is routed to the ice storage modules 134 via the coolant supply line 132. The coolant (which is heated in the main condenser 146 as described below) is passed through the heat exchanger 124 which is disposed in the ice in the tank 126 and transfers heat into the ice. The transferred heat melts the ice while the coolant is cooled by the loss of heat.

At stage 276, the chilled coolant is routed to the main refrigerant condenser 146 to cool the refrigerant. The glycol coolant leaves the ice storage modules 134 and is pumped by the secondary glycol pump 110 to the main condenser 146. Heat transfers through the heat exchanger of the main condenser 146 from the refrigerant from the line 180 to the glycol coolant, heating the glycol coolant and cooling the main refrigerant. The controller 194 controls the flow of the glycol coolant to maintain the desired pressure and temperature of the main refrigerant as measured at the inlet pressure sensor 162. The heated glycol coolant then is recycled through the ice storage modules 134 for further cooling. This continues until either external chilled water cooling becomes operational, cooling of the main refrigerant is not desired (e.g., the IT equipment is not to be cooled), or the ice in the storage modules 134 is depleted such that the glycol coolant can no longer adequately cool the main refrigerant.

Other embodiments are within the scope and spirit of the appended claims. For example, functions described above, e.g., regarding control of devices, can be implemented using software, hardware, firmware, hardwiring, or combinations of any of these. Features implementing functions may also be physically located at various positions, including being distributed such that portions of functions are implemented at different physical locations. Also, other quantities of the ice storage modules 134 could be used.

Further, while the description above refers to the invention, more than one invention may be described.

What is claimed is:

1. A system for use in an information technology equipment rack housing and for use with a pumped refrigerant cooling system that includes vapor and liquid refrigerant lines, the system comprising:

a tank configured to hold water;

a heat exchanger disposed in the tank and configured to convey a two-phase liquid and vapor refrigerant and to transfer heat between water in the tank and the refrigerant;

a first valve comprising first and second ports and being connected to the liquid and vapor refrigerant lines and configured to selectively connect the liquid refrigerant line to the first port and the vapor refrigerant line to the second port in a first mode and to connect the liquid refrigerant line to the second port and the vapor refrigerant line to the first port in a second mode;

a second valve directly connected to the first port of the first valve and to an inlet of the heat exchanger, the second valve being a thermostatic expansion valve and configured to operate to deliver liquid refrigerant to the heat exchanger when the first valve is in the first mode;

a third valve directly connected to the first port of the first valve and to the inlet of the heat exchanger and configured to direct vapor refrigerant from the first port of the first valve to the inlet of the heat exchanger independent of the second valve and configured to operate to deliver vapor refrigerant to the heat exchanger by bypassing the second valve when the first valve is in the second mode; and a liquid/vapor pump directly connected to an outlet of the heat exchanger and to the second port of the first valve, the liquid/vapor pump being configured to pump refrigerant in only one direction from the heat exchanger to the first valve.

2. A system for providing thermal energy storage in the form of ice to cool heat producing equipment, the system comprising:
- a tank configured to hold water;
- a first heat exchanger disposed in the tank;
- a system housing configured to be rack-mountable inside an information technology equipment rack; and
- cooling means for transferring heat out of water in the tank to generate ice, and is configured to convey a two-phase liquid and vapor refrigerant through the first heat exchanger to transfer heat between the water and the refrigerant, the cooling means comprises
- a first valve comprising first and second ports and being connected to the liquid and vapor refrigerant lines and configured to selectively connect the liquid refrigerant line to the first port and the vapor refrigerant line to the second port in a first mode and to connect the liquid refrigerant line to the second port and the vapor refrigerant line to the first port in a second mode; a second valve directly connected to the first port of the first valve and to an inlet of the heat exchanger, the second valve being a thermostatic expansion valve and configured to operate to deliver liquid refrigerant to the heat exchanger when the first valve is in the first mode; a third valve directly connected to the first port of the first valve and to the inlet of the heat exchanger and configured to direct vapor refrigerant from the first port of the first valve to the inlet of the heat exchanger independent of the second valve and configured to operate to deliver vapor refrigerant to the heat exchanger by bypassing the second valve when the first valve is in the second mode, and
- a liquid/vapor pump connected to the heat exchanger and the second port of the first valve, the liquid/vapor pump being configured to pump refrigerant in only one direction from the heat exchanger to the valve,
- wherein the tank and cooling means are disposed inside the system housing.

3. The system of claim 1 further comprising a controller to control the operation of at least one of the second valve and the third valve.

* * * * *